United States Patent

Werker

[11] Patent Number: 5,103,191
[45] Date of Patent: Apr. 7, 1992

[54] CIRCUIT CONFIGURATION FOR PHASE LOCKING

[75] Inventor: Heinz Werker, Eching, Fed. Rep. of Germany

[73] Assignee: Siemens Aktiengesellschaft, Munich, Fed. Rep. of Germany

[21] Appl. No.: 557,600

[22] Filed: Jul. 25, 1990

[30] Foreign Application Priority Data

Jul. 25, 1989 [EP] European Pat. Off. ........ 89113676.4

[51] Int. Cl.$^5$ .................. H03L 7/085; H04L 7/04
[52] U.S. Cl. .......................... 331/1 A; 331/25; 331/16; 331/17; 331/27; 332/128
[58] Field of Search ............... 318/606, 607, 608, 615, 318/616, 628, 683; 331/1 R, 1 A, 16, 17, 18, 25, 27, 34; 332/117, 123, 126, 127, 128

[56] References Cited

U.S. PATENT DOCUMENTS

| | | | |
|---|---|---|---|
| 4,271,384 | 6/1981 | Beling et al. | 318/685 |
| 4,952,888 | 8/1990 | Izumi | 332/124 |
| 4,952,889 | 8/1990 | Irwin et al. | 332/128 |
| 4,954,788 | 9/1990 | Leis et al. | 331/16 |
| 4,959,618 | 9/1990 | Shier | 328/155 |
| 4,970,472 | 11/1990 | Kennedy et al. | 331/8 |

FOREIGN PATENT DOCUMENTS

88/08644 11/1988 PCT Int'l Appl. .
2075294 11/1981 United Kingdom .
2194714 3/1988 United Kingdom .

OTHER PUBLICATIONS

IEEE Transactions on Communications, vol. COM-28, No. 11, Nov. 1980; Floyd M. Gardner: "Charge-Pump Phase-Lock Loops".

*Primary Examiner*—Bentsu Ro
*Attorney, Agent, or Firm*—Herbert L. Lerner; Laurence A. Greenberg

[57] ABSTRACT

A circuit configuration includes a controllable oscillator issuing an output signal. A phase detector is acted upon by a reference signal and by the output signal of the oscillator. A first charge pump is controllable by the phase detector and has an input connected to the phase detector and an output. A loop filter is connected between the first charge pump and the oscillator for triggering the oscillator. A second charge pump is connected parallel to the output of the first charge pump.

1 Claim, 1 Drawing Sheet

CIRCUIT CONFIGURATION FOR PHASE LOCKING

The invention relates to a circuit configuration for phase locking or for tracing, hunting or followup synchronization, having a phase detector being acted upon by a reference signal and by the output signal of a controllable oscillator, and a charge pump being controllable by the phase detector with the interposition of a loop filter for triggering the oscillator.

BACKGROUND OF THE INVENTION

One closed-loop control principle which is often used, particularly in communications technology, such as for frequency demodulation and frequency multiplication, is phase locking (with a phase locked loop or PLL). In that process, the frequency of an oscillator is set in such a way that it agrees with a reference frequency, in fact so precisely that the phase displacement does not drift. Typical circuit configurations for phase locking have a controllable oscillator which is provided for this purpose and which issues an output signal that is compared with a reference frequency in a phase detector having an output signal which in turn sets the frequency of the controllable oscillator through a controlled system.

For instance, in a configuration known from an article by Floyd M. Gardner, entitled "Charge-Pump Phase-Lock Loops", in IEEE Transactions on Communications, Vol. COM-28, No. 11, Nov. 1980, a charge pump with a loop filter connected to the output side thereof is used as the controlled system. Upon the occurrence of a phase displacement between a reference signal and the output signal of the controllable oscillator, the charge pump is triggered by the phase detector in such a way that the loop filter is charged or discharged in pulsed fashion. In the locked state of the circuit configuration, in other words when virtually no phase displacement occurs, no further charge or discharge pulses are generated. The output signal of the loop filter, which is the voltage across the capacitor of a loop filter constructed as a passive RC element in the known circuit configuration, thus continues to be impressed, and no closed-loop control takes place. The jittering range of the entire configuration depends substantially on the internal gate transit times in the phase detector.

However, the resultant jittering is excessive for many applications.

SUMMARY OF THE INVENTION

It is accordingly an object of the invention to provide a circuit configuration for phase locking, which overcomes the hereinafore-mentioned disadvantages of the heretofore-known devices of this general type and in which less jittering occurs.

With the foregoing and other objects in view there is provided, in accordance with the invention, a circuit configuration comprising a controllable oscillator issuing an output signal, a phase detector being acted upon by a reference signal and by the output signal of the oscillator, a first charge pump controllable by the phase detector having an input connected to the phase detector and an output, a loop filter connected between the first charge pump and the oscillator for triggering the oscillator, and a second charge pump being connected parallel to the output of the first charge pump.

An advantage of the invention is that a marked reduction in jittering is attained with little expense for circuitry.

Other features which are considered as characteristic for the invention are set forth in the appended claims.

Although the invention is illustrated and described herein as embodied in a circuit configuration for phase locking, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

DETAILED DESCRIPTION OF THE PREFERRED EMBODIMENT

Figure 1:
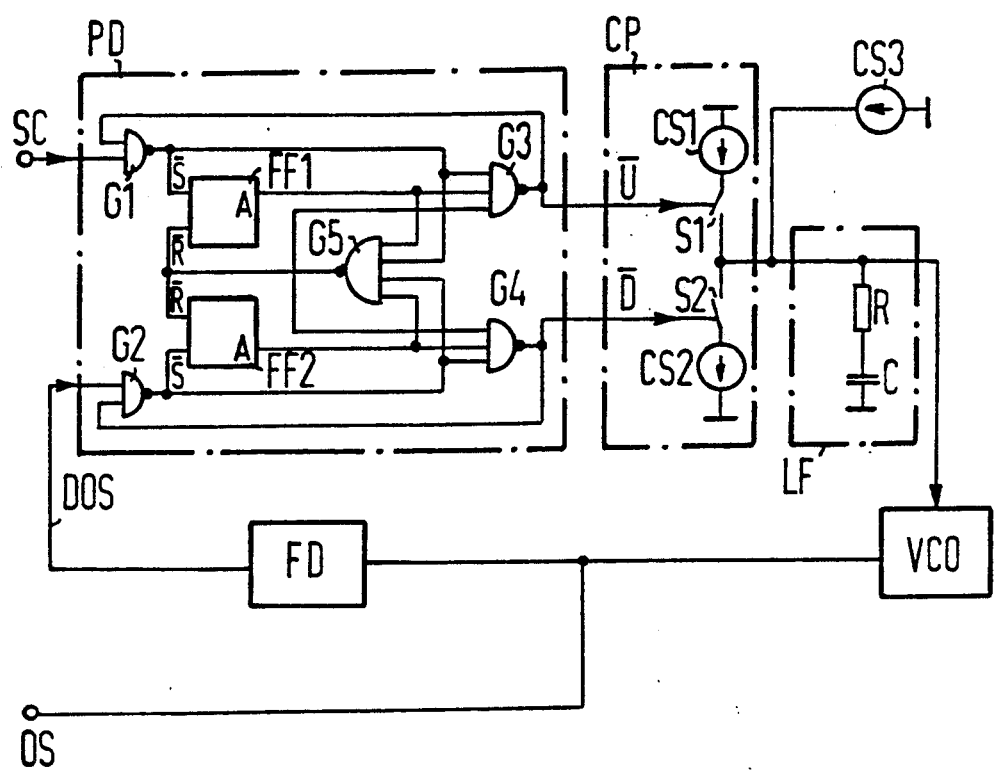
FIG. 1 is a schematic and block circuit diagram of an exemplary embodiment of a circuit according to the invention.

Referring now to the single FIGURE of the drawing in detail, there is seen a circuit configuration for phase locking according to the invention, in the form of a frequency multiplier. To this end, a phase detector PD is acted upon by a reference signal SC and by an output signal OS of a controllable oscillator VCO. A charge pump CP is controllable by the phase detector PD. A loop filter LF is connected to the output side of the charge pump CP. The voltage-controlled oscillator VCO has an input which is connected to the output of the loop filter. A frequency divider FD divides the frequency of the output signal OS of the controlled oscillator VCO by a given value and thus emits the output signal DOS.

The phase detector PD includes five NAND gates G1 ... G5 and two RS flip-flops FF1, FF2. The first input of the gate G1 is acted upon by the reference signal SC, and the second input is acted upon by one output signal e,ovs/U/ of the phase detector PD. The first input of the gate G2 is acted upon by the signal DOS and the second input is acted upon by another output signal e,ovs/D/ of the phase detector PD. The output of the gate G1 is carried to the inverting setting input e,ovs/S/ of the flip-flop FF1, to the first input of the gate G3, and to the first input of the gate G5. Correspondingly, the output of the gate G2 is connected to the inverting setting input e,ovs/S/ of the flip-flop FF2, to the first input of the gate G4, and to the second input of the gate G5. The output A of the flip-flop FF1 is connected on one hand to the second input of the gate G3 and on the other hand to the third input of the gate G5. The output A of the flip-flop FF2 is connected to the second input of the gate G4 and to the fourth input of the gate G5. The inverting resetting inputs of the two flip-flops FF1 and FF2 and the third inputs of the gates G3 and G4 are connected to the output of the gate G5. The output of the gate G3 carries the signal e,ovs/U/, and the output of the gate G4 carries the signal e,ovs/D/.

The charge pump CP has two current sources CS1 and CS2 which are connected to reference potential for respectively charging and discharging the loop filter LF. Each of the current sources CS1 and CS2 can be connected through a respective controllable switch S1 and S2 to the loop filter LF. In this process the switch S1 is controlled by the signal e,ovs/U/, and the switch S2 is controlled by the signal e,ovs/D/. The loop filter LF itself includes a series circuit of a resistor R and a capacitor C, which leads from the output of the charge pump CP, as well as from the input of the controlled oscillator VCO, to reference potential.

According to the invention, a further charge pump, which is a further current source CS3 (for instance a charging current source) being connected to the reference potential in the illustrated exemplary embodiment, is connected parallel to the charge pump CP. As a result, when the circuit configuration is locked, the frequency of the output signal OS of the controllable oscillator VCO is always regulated in a preferential direction. This in turn results in jittering being reduced very sharply.

In an application as a frequency multiplier, one frequency divider is generally connected upstream of each of the inputs of the phase detector. In the present exemplary embodiment, only the frequency divider FD is connected between the output of the controlled oscillator VCO and one input of the phase detector PD for this purpose. However, in addition to its use as a frequency multiplier, it is also possible to use this configuration in the same manner, for instance as a frequency demodulator and frequency detector. Embodiments of the phase detector, charge pump and loop filter that deviate from the exemplary embodiment are also possible.

I claim:

1. A circuit configuration, comprising
a controllable oscillator for issuing an output signal,
a loop filter connected to upstream of said controllable oscillator,
a controllable charge pump connected to upstream of said loop filter, said charge pump having an output and including two current sources for selectively charging and discharging said loop filter, said current sources being switchable by respective control signals,
a phase detector, said phase detector including:
a first NAND gate having two inputs and an inverted output, one of said inputs being acted upon by a reference signal and the other of said inputs being acted upon by one of the control signals for said switchable current sources,
a second NAND gate having two inputs and an inverted output, one of said inputs being acted upon by the output signal issued by said controllable oscillator and the other of said inputs being acted upon by the other of the control signals for said switchable current sources,
first and second flip-flops having setting inputs, outputs and coupled resetting inputs, said setting inputs being connected to a respective one of said inverted outputs of said first and second NAND gates,
a third NAND gate having four inputs and an inverted output, said four inputs respectively being connected to said outputs of said flip-flops and said inverted outputs of said first and second NAND gates, said inverted output of said third NAND gate being connected to said coupled resetting inputs of said flip-flops,
a fourth NAND gate having inputs and an inverted output, one of said inputs of said fourth NAND gate being acted upon by said inverted output of said third NAND gate, the other of said inputs of said fourth NAND gate respectively being connected to said output of said first flip-flop and said inverted outputs of said first and second NAND gates, one of the control signals for said switchable current sources being present at said inverted output of said fourth NAND gate, and
a fifth NAND gate having inputs and an inverted output, said inputs being connected respectively with said output of said second flip-flop and with said inverted outputs of said second and third NAND gates, the other of the control signals for said switchable current sources being present at said inverted output of said fifth NAND gate;
and a constant current source connected in parallel with said output of said controllable charge pump.

* * * * *